United States Patent
Cheng et al.

(10) Patent No.: US 10,460,944 B2
(45) Date of Patent: Oct. 29, 2019

(54) FULLY DEPLETED SEMICONDUCTOR ON INSULATOR TRANSISTOR WITH ENHANCED BACK BIASING TUNABILITY

(71) Applicant: International Business Machines Corporation, Armonk, NY (US)

(72) Inventors: Kangguo Cheng, Schenectady, NY (US); Shawn Fetterolf, Cornwall, VT (US); Terry Hook, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/840,332

(22) Filed: Dec. 13, 2017

(65) Prior Publication Data

US 2019/0181264 A1 Jun. 13, 2019

(51) Int. Cl.
*H01L 21/28* (2006.01)
*H01L 29/78* (2006.01)
(Continued)

(52) U.S. Cl.
CPC ...... *H01L 21/28291* (2013.01); *H01L 23/528* (2013.01); *H01L 29/0649* (2013.01);
(Continued)

(58) Field of Classification Search
None
See application file for complete search history.

(56) References Cited

U.S. PATENT DOCUMENTS 5,164,805 A * 11/1992 Lee .................. H01L 27/0605
257/351
5,751,037 A * 5/1998 Aozasa ............. H01L 21/28282
257/315

(Continued)

OTHER PUBLICATIONS

Boscke, et al., "Ferroelectricity in Hafnium Oxide: CMOS compatible Ferroelectric Field Effect Transistors," © 2011 IEEE, 4 pages.
(Continued)

*Primary Examiner* — Phat X Cao
*Assistant Examiner* — Kevin Quinto
(74) *Attorney, Agent, or Firm* — Amin, Turocy & Watson, LLP

(57) ABSTRACT

Technologies for providing a semiconductor device, which can comprise a fully depleted semiconductor on insulator transistor and a method for forming the same are described. Various embodiments disclose a buried dielectric layer coupled to a semiconductor layer, and a back-gate stack is coupled to the buried dielectric layer, the back-gate stack comprising a back-gate conductor layer, a ferroelectric material layer coupled to the back-gate conductor layer, and a back-gate contact layer coupled to the ferroelectric material layer. A gate insulator can be coupled to the semiconductor layer, and a gate can be coupled to the gate insulator; the semiconductor layer can comprise a source, a drain and a channel region between the source and the drain. The negative capacitance property of the ferroelectric insulator provides back biasing of the fully depleted semiconductor on insulator transistor, including if using a relatively thick buried dielectric layer and a normal operating voltage.

4 Claims, 12 Drawing Sheets

(51) Int. Cl.
    *H01L 23/528* (2006.01)
    *H01L 29/66* (2006.01)
    *H01L 29/06* (2006.01)
    *H01L 29/423* (2006.01)

(52) U.S. Cl.
    CPC .... *H01L 29/42356* (2013.01); *H01L 29/6684* (2013.01); *H01L 29/66484* (2013.01); *H01L 29/7831* (2013.01); *H01L 29/7838* (2013.01); *H01L 29/78391* (2014.09)

(56) References Cited

U.S. PATENT DOCUMENTS

| | | | |
|---|---|---|---|
| 5,883,423 A * | 3/1999 | Patwa | H01L 27/0688 257/532 |
| 5,942,781 A | 8/1999 | Burr et al. | |
| 6,043,536 A | 3/2000 | Numata et al. | |
| 6,069,819 A | 5/2000 | Tiwari | |
| 6,072,217 A | 6/2000 | Burr | |
| 6,100,567 A | 8/2000 | Burr | |
| 6,517,995 B1 * | 2/2003 | Jacobson | B01J 19/0046 101/28 |
| 6,989,569 B1 | 1/2006 | Hiramoto et al. | |
| 7,772,647 B2 | 8/2010 | Anderson et al. | |
| 8,030,145 B2 | 10/2011 | Chang et al. | |
| 8,367,490 B2 | 2/2013 | Zhu et al. | |
| 8,552,500 B2 | 10/2013 | Dennard et al. | |
| 9,460,770 B1 * | 10/2016 | Nicholes | G11C 14/00 |
| 9,484,270 B2 | 11/2016 | Hook et al. | |
| 2005/0037582 A1 | 2/2005 | Dennard et al. | |
| 2008/0151599 A1 | 6/2008 | Nishinohara et al. | |
| 2016/0111534 A1 | 4/2016 | Kumar et al. | |

OTHER PUBLICATIONS

Khan, et al., "Negative Capacitance in a Ferroelectric Capacitor," Last Accessed: Nov. 9, 2017, 40 pages.
Mueller, et al., "Next-Generation Ferroelectric Memories Based on FE-HfO2," © 2015 IEEE, 4 pages.
Li, et al., "Sub-60mV-Swing Negative-Capacitance FinFET without Hysteresis," © 2015 IEEE, 4 pages.
wikipedia.org, "Low-k dielectric," Retrieved: Dec. 1, 2017, 3 pages.

* cited by examiner

US 10,460,944 B2

1

FULLY DEPLETED SEMICONDUCTOR ON INSULATOR TRANSISTOR WITH ENHANCED BACK BIASING TUNABILITY

BACKGROUND

The subject disclosure relates generally to semiconductors, and more particularly to fully depleted semiconductor on insulator (FDSOI) transistors.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a device can comprise a buried dielectric layer over a semiconductor layer, and a back-gate stack over the buried dielectric layer. The back-gate stack can comprise a back-gate conductor layer, a ferroelectric material layer over the back-gate conductor layer, and a back-gate contact layer over the ferroelectric material layer.

According to another embodiment, a method is provided. The method can comprise forming a fully depleted semiconductor on insulator device, comprising: forming a semiconductor layer coupled to a buried dielectric layer; forming a gate structure coupled to the semiconductor layer; and forming a back-gate stack coupled to the buried dielectric layer. Forming the back-gate stack coupled to the buried dielectric layer can comprise forming a back-gate conductor layer of the back-gate stack coupled to the buried dielectric layer, forming a ferroelectric material layer coupled to the back-gate conductor layer, and forming a back-gate contact layer coupled to the ferroelectric material layer.

According to yet another embodiment, a semiconductor device can comprise a back-gate stack, the back-gate stack comprising a back-gate contact layer, a ferroelectric material layer coupled to the back-gate contact layer, and a back-gate conductor layer coupled to the ferroelectric material layer; a buried dielectric layer coupled to the back-gate conductor layer of the back-gate stack; a semiconductor layer coupled to the buried dielectric layer, the semiconductor layer comprising a source, a drain and a channel region between the source and the drain; and a gate insulator coupled to the channel region and coupled to a gate.

DETAILED DESCRIPTION

Figure 1:
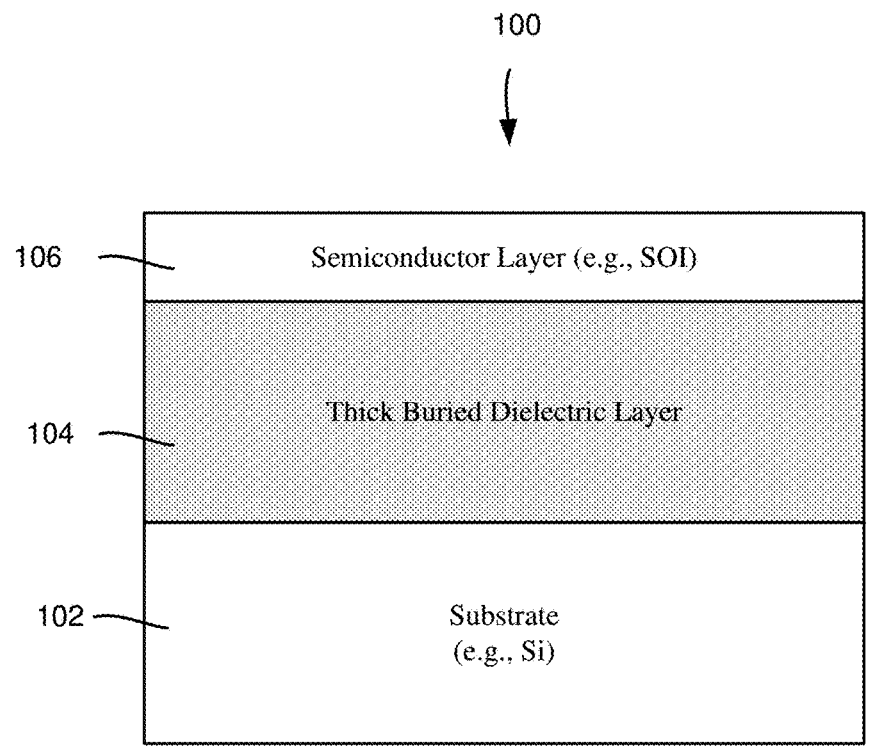
FIG. 1 is a cross-sectional view of a semiconductor structure in an initial state according to an example embodiment of the present disclosure.

The following detailed description is merely illustrative and is not intended to limit embodiments and/or application or uses of embodiments. Furthermore, there is no intention to be bound by any expressed or implied information presented in the preceding sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures, substrate materials and process features, and steps can be varied within the scope of the present disclosure.

It will also be understood that when an element such as a layer, region or substrate is referred to as being "on" or "over" another element, it can be directly on the other element or intervening elements can also be present. In contrast, only if and when an element is referred to as being "directly on" or "directly over" another element, are there are no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., Graphical Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Structures and methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip can be mounted in a single chip package (such as a plastic carrier, with leads that are affixed to a motherboard or other higher-level carrier) or in a multichip package (such as a ceramic carrier that has either or both surface interconnections or buried interconnections). In any event the chip then can be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment," as well any other variations, appearing in various places throughout the specification are not necessarily all referring to the same embodiment.

Referring now to the drawings in which like numerals represent the same of similar elements, FIGS. 1-12 illustrate various structures and/or processes for fabricating semiconductor device, e.g., comprising one or more fully depleted semiconductor on insulator (FDSOI) transistors and/or interconnects. Repetitive description of like elements employed in respective embodiments is omitted for sake of brevity.

FIG. 1 shows a partially fabricated semiconductor device 100 (e.g., FDSOI substrate) comprising a substrate 102, a buried dielectric layer 104, and a semiconductor layer 106. Substrate 102 of the semiconductor device 100 can comprise any suitable material as a bulk substrate (e.g., comprising, but not limited to, a support wafer of silicon, silicon dioxide, aluminum oxide, and so on). The buried dielectric layer 104 can comprise any suitable dielectric material such as a buried oxide (or BOX) layer, which can have a thickness ranging from 25 nanometers (nm) to 100 nm on the substrate 102, and a thin semiconductor layer 106 (e.g., approximately 10 nm silicon) on the BOX layer. As is known, other materials and thicknesses can be used instead of or in addition to the examples described herein, and none of the examples are to be considered limiting.

Thus, in one embodiment, the buried dielectric layer 104 is a buried oxide (or BOX) layer. Notwithstanding, other insulator layers such as those based on laminates, are capable of being used as a buried dielectric layer, and thus buried oxide is only one non-limiting example of a buried dielectric layer as used herein.

The substrate 102 can be a semiconductor or an insulator with an active surface semiconductor layer. The substrate 102 layer can be crystalline, semi-crystalline, microcrystalline, or amorphous. The substrate 102 can be essentially (i.e., except for contaminants) a single element (e.g., silicon), primarily (i.e., with doping) of a single element, for example, silicon (Si) or germanium (Ge), or the substrate 102 can include a compound, for example, $Al_2O_3$, $SiO_2$, GaAs, SiC, or SiGe. The substrate 102 can also have multiple material layers, for example, a semiconductor-on-insulator substrate (e.g., SeOI), a silicon-on-insulator substrate (e.g., SOI), germanium-on-insulator substrate (e.g., GeOI), or silicon-germanium-on-insulator substrate (e.g., SGOI). The substrate 102 can also have other layers forming the substrate 102, including high-k oxides and/or nitrides. In one or more embodiments, the substrate 102 can be a silicon wafer. In an embodiment, the substrate 102 is a single crystal silicon wafer. An example, non-limiting thickness of substrate 102 is typically in the range of hundreds to thousands of micrometers.

The buried dielectric layer 104 can comprise silicon oxide, silicon nitride, silicon oxynitride, boron nitride, SiOCN, SiBCN, SiOC, SiCN, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. Example, non-limiting buried dielectric layer 104 thicknesses range from 25 nm to 100 nm.

The FDSOI layer 106 can comprise silicon, germanium, silicon germanium, silicon carbide, and those materials comprising or being III-V compound semiconductors and/or II-VI compound semiconductors. The semiconductor substrate can also comprise an organic semiconductor or a layered semiconductor such as, for example, Si/SiGe, a silicon-on-insulator or a SiGe-on-insulator. A portion or entire semiconductor substrate can be amorphous, polycrystalline, or monocrystalline. In addition to the aforementioned types of semiconductor substrates, the semiconductor substrate employed in the present embodiments can also comprise a hybrid oriented (HOT) semiconductor substrate in which the HOT substrate has surface regions of different crystallographic orientation. The semiconductor substrate can be doped, undoped or contain doped regions and undoped regions therein. The semiconductor substrate can contain regions with strain and regions without strain therein, or contain regions of tensile strain and compressive strain. Example, non-limiting FDSOI layer 106 thicknesses can range from 2 nm to 20 nm.

The buried dielectric layer 104 is referred to herein as "thick" to contrast the thick buried dielectric layer 104 with thinner buried dielectric layers. More particularly, one or more embodiments of the FDSOI transistor technology can have the capability of tuning transistor threshold voltage, and thus power management, by back gating (e.g., applying a voltage below the buried dielectric layer 104). The technology described herein is directed to an FDSOI transistor with enhanced back biasing tunability, via a relatively thick buried dielectric layer, and thus one or more embodiments can avoid or reduce the likelihood of experiencing drawbacks of a thinner BOX layer (for example, potential shorts between source/drain contacts to the back-gate that can result from the thinness of the BOX layer).

Figure 2:
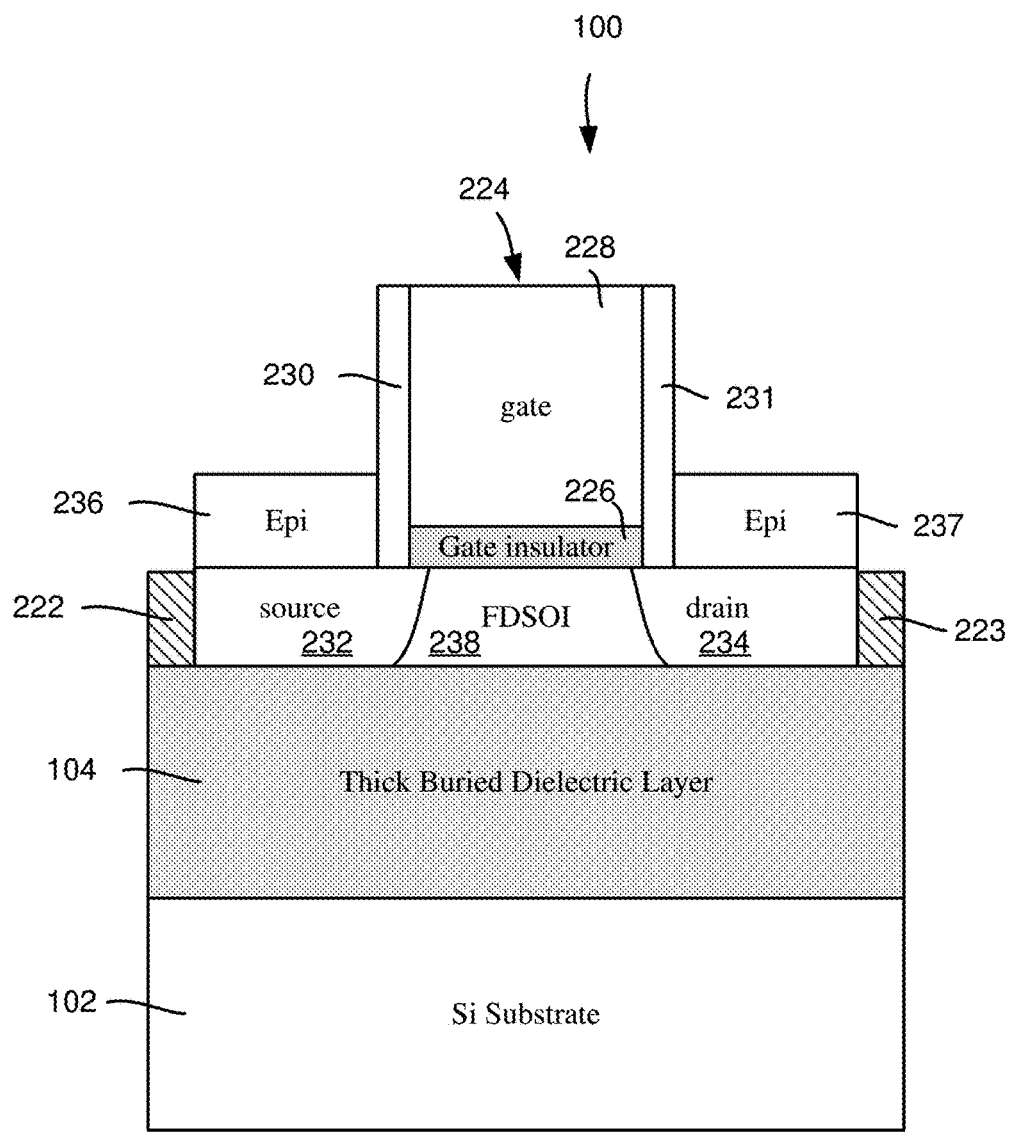
FIG. 2 is a cross-sectional view of the semiconductor structure after forming a fully depleted semiconductor on insulator (FDSOI) transistor in a semiconductor layer of the semiconductor structure according to an example embodiment of the present disclosure.

FIG. 2 shows the semiconductor device 100 after forming a next part of an FDSOI transistor. The exemplified semiconductor device 100 is formed with isolations 222 and 223 (e.g., one or more shallow trench isolations can be formed in a substrate layer 210 such as by etching). Also shown in FIG. 2 is a gate structure 224 comprising gate insulator 226 (i.e. a gate dielectric) and gate conductor 228, and spacers 230 and 231 on sidewalls of the gate structure 224. For example, a sidewall spacer structure can be formed overlying a portion of the gate structure 224 in a known manner, generally to protect the gate structure 224.

FIG. 2 also shows a source 232 and a drain 234 formed in the semiconductor layer, which can have associated epitaxy (blocks 236 and 237) e.g., to reduce resistance. The FDSOI channel (inversion layer) is represented in FIG. 2 as an FDSOI channel region 238. The gate insulator 226 is shown as being over this channel region 238.

The gate insulator 226, by way of example and not limitation, can comprise silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. In some embodiments, the gate insulator 226 can comprise a combination of the above materials. Example non-limiting thicknesses can range from 1 nm to 5 nm.

The gate conductor 228, by way of example and not limitation, can comprise doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition.

The gate conductor 228 can further comprise a work function setting layer. The work function setting layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, the gate is comprised of a conductor material which serves as the gate conductor and work function setting layer. Non-limiting vertical height range of the gate conductor 228 can be 20 nm to 100 nm. Non-limiting lateral width of gate conductor 228 can range from 10 nm to 100 nm. The gate conductor 228 can further comprise a dielectric cap (not shown).

The spacer 230, by way of example and not limitation, can comprise silicon oxide, silicon nitride, silicon oxynitride, boron nitride, SiOCN, SiBCN, SiOC, SiCN, high-k materials, or any suitable combination of those materials. Example non-limiting thicknesses can range from 3 nm to 10 nm.

The raised source/drain 237 is typically formed by epitaxy. Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing chemical vapor deposition (LRPCVD), or other suitable process. Epitaxial silicon, silicon germanium (SiGe), germanium (Ge) and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$. Example non-limiting thicknesses can range from 10 nm to 50 nm.

The source and drain 232 and 234, respectively, can be formed by any suitable doping technique such as dopant diffusion from the doped raised source/drain 237. Other suitable doping techniques can comprise ion implantation, gas phase doping, plasma doping, plasma immersion ion implantation, cluster doping, infusion doping, liquid phase doping or solid phase doping, etc. Dopant types for silicon, silicon germanium, or germanium can be, for example, n-type dopant selected from a group of phosphorus (P), arsenic (As) and antimony (Sb), and a p-type dopant selected from a group of boron (B), boron fluoride (BF2), gallium (Ga), indium (In), and thallium (Tl).

Figure 3:
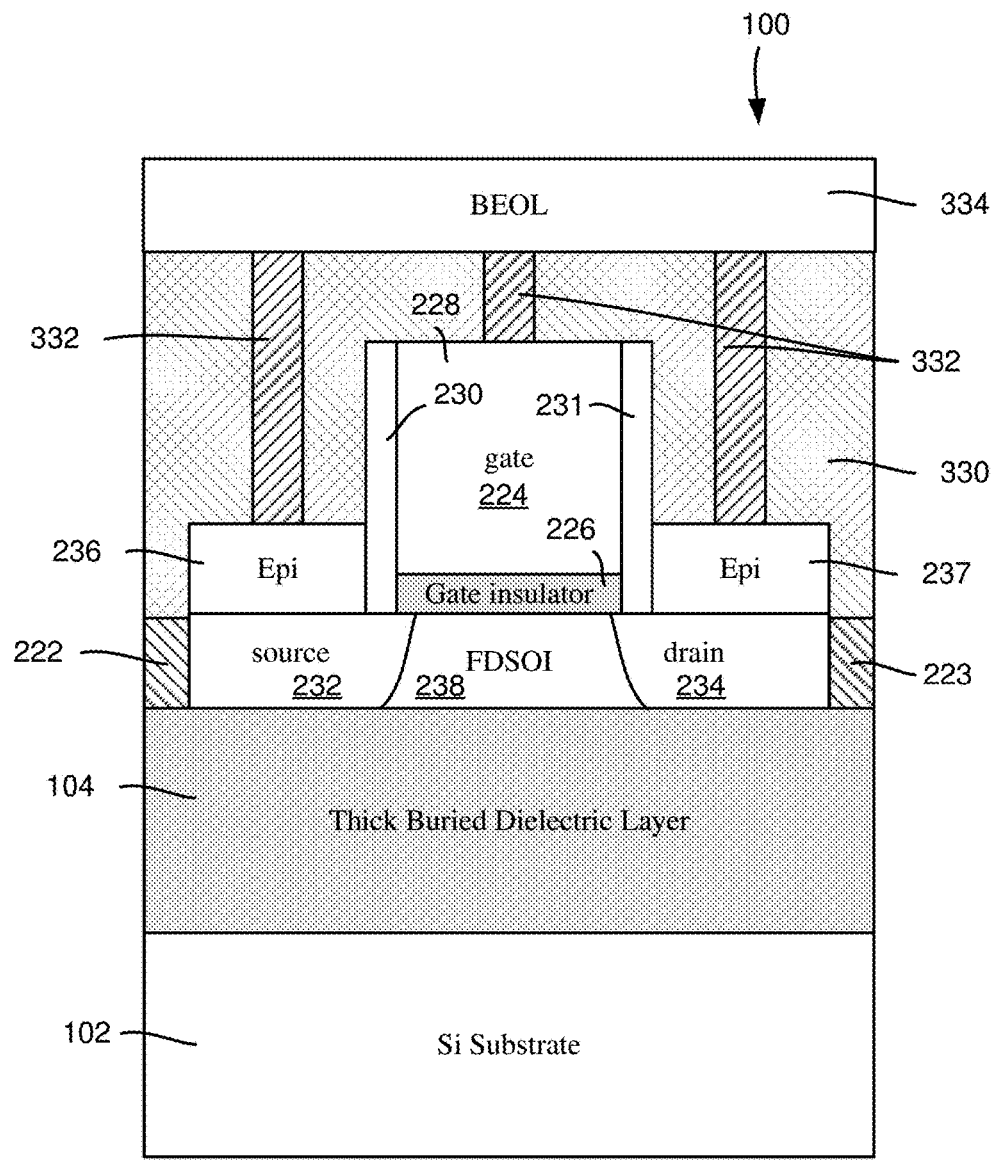
FIG. 3 is a cross-sectional view of the semiconductor structure after depositing inter-level dielectric material, forming contacts, and forming back-end-of-line (BEOL) wiring according to an example embodiment of the present disclosure.

FIG. 3 shows further fabrication of the semiconductor device 100 after depositing interlevel dielectric (ILD) 330, along with the forming of contacts 332 and the forming of back-end-of-line (BEOL) wiring 334, e.g., in a generally known manner. Note that for simplicity, only one portion of the ILD 330 that appears in FIG. 3 is labeled as ILD 330.

Figure 4:
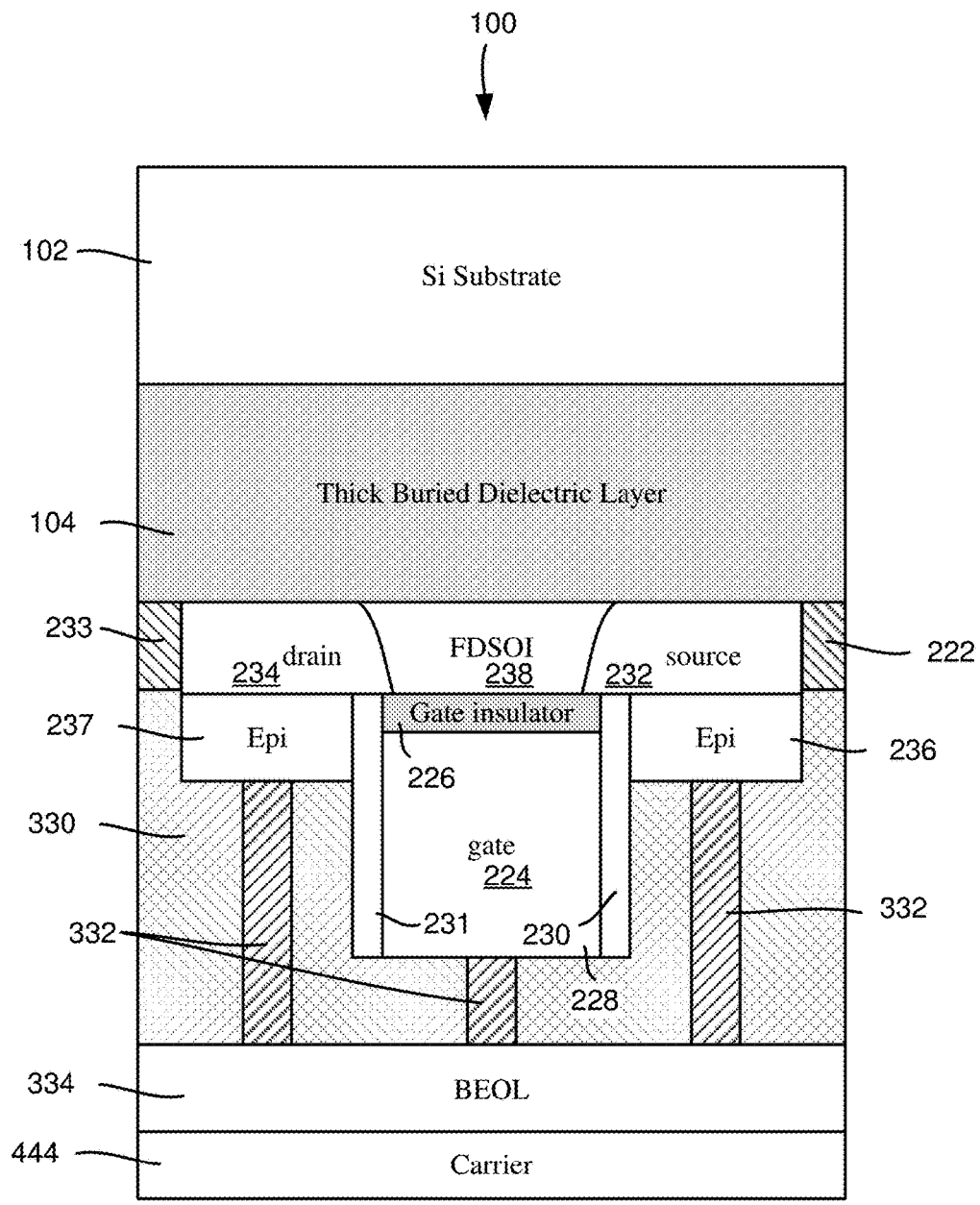
FIG. 4 is a cross-sectional view of the semiconductor structure after flipping the semiconductor structure and bonding the structure to a carrier according to an example embodiment of the present disclosure.

FIG. 4 shows the semiconductor device 100 (wafer) flipped and bonded to a carrier 444 (e.g., another silicon wafer or a package). Recall that as set forth herein, orientation is generally relative, e.g., "over" in one orientation is synonymous with "under" in a flipped orientation, and so forth.

Figure 5:
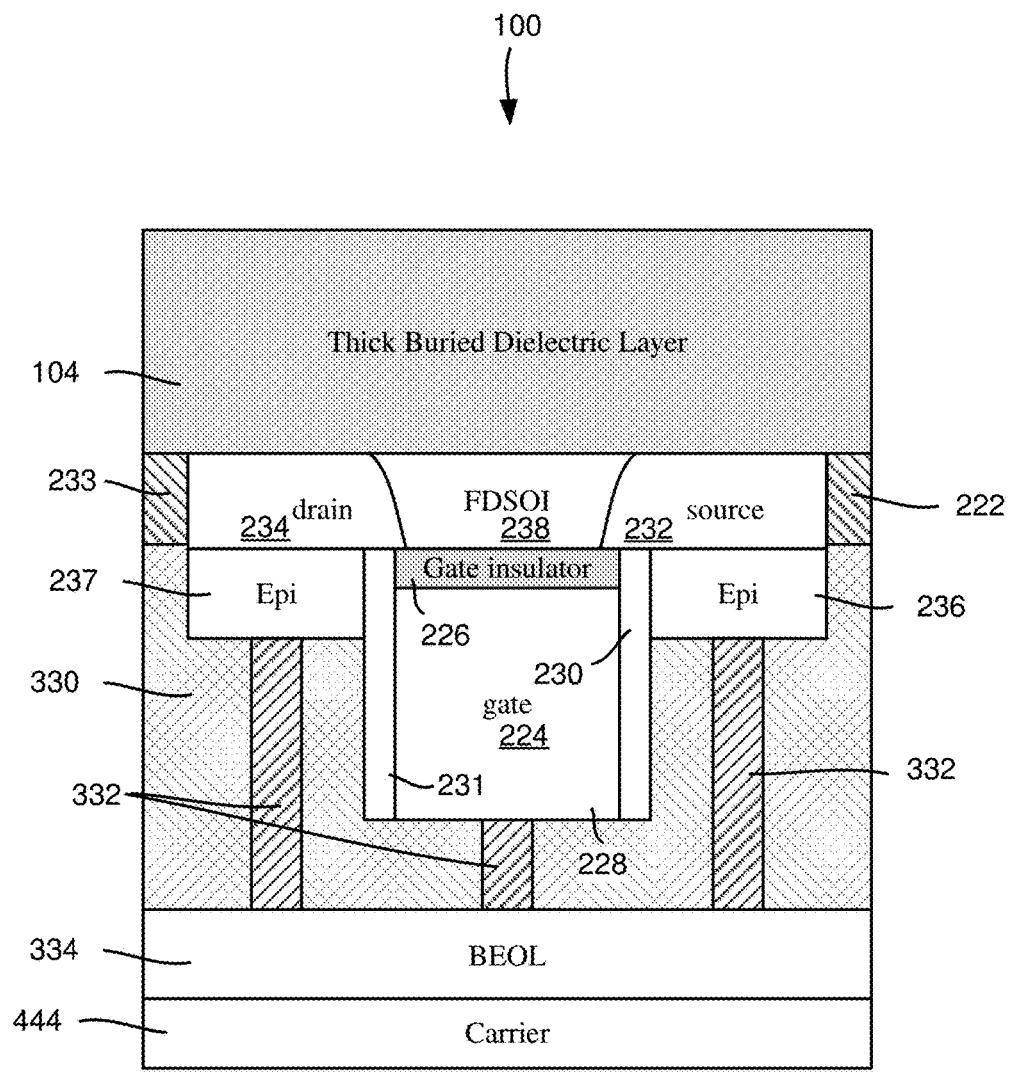
FIG. 5 is a cross-sectional view of the flipped semiconductor structure after removing a substrate according to one embodiment of the present disclosure.

FIG. 5 shows a subsequent state in the fabrication of the semiconductor device 100, in which the semiconductor device 100 is shown after the (e.g., silicon) substrate 102 has been removed to expose the thick buried dielectric layer 104. Removal can, for example, be accomplished by etching the silicon, (e.g., by an ammonia etch or the like), stopping (etch-stop) on the thick buried dielectric layer 104. In some embodiments, polishing in combination with etching can be used to remove the substrate 102.

Figure 6:
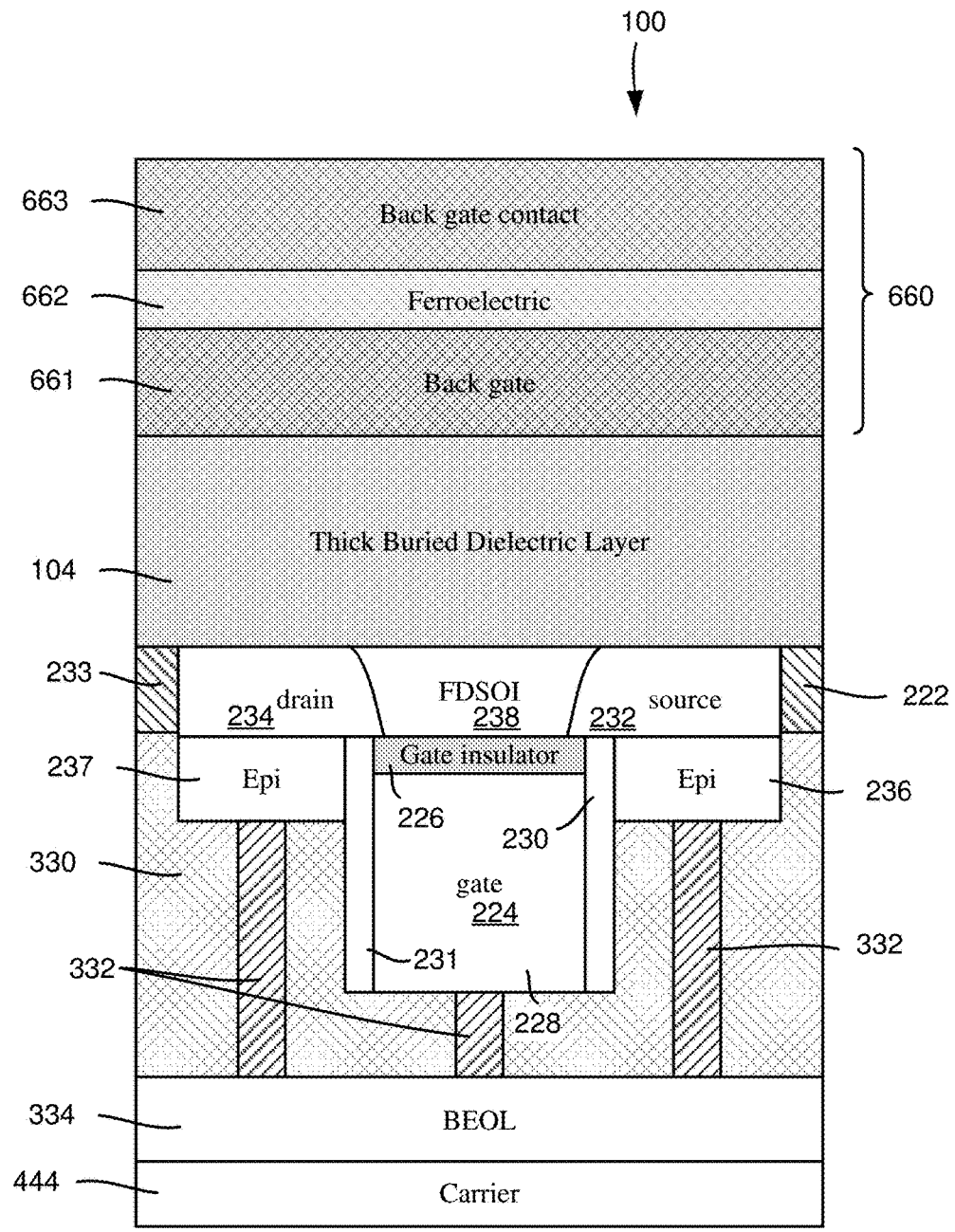
FIG. 6 is a cross-sectional view of the flipped semiconductor structure after forming a back-gate stack according to an example embodiment of the present disclosure.

FIG. 6 shows another subsequent state in the fabrication of the semiconductor device 100. In FIG. 6, a back-gate stack 660 comprising a back-gate conductor layer 661 (e.g., a conductor such as a metal, or a conductive metallic, compound, doped semiconductor, or any suitable combination of those materials.), a ferroelectric material layer 662 (e.g., hafnium oxide), and a back-gate contact layer 663 (e.g., a metal, or a conductive metallic, compound, doped semiconductor, or any suitable combination of those materials.) is deposited on the thick buried dielectric layer 104. Examples for the thick buried dielectric layer 104 include a buried oxide (BOX) layer with a thickness on the order of 25 nm to 50 nm with a BOX dielectric constant on the order of 3.9. The ferroelectric material can comprise hafnium oxide, with a thickness on the order of 200 nm, and a dielectric constant on the order of 20. Note that these components as depicted are not to scale, including relative to one another.

In this fabrication state, there is an FDSOI with a thick buried dielectric layer 104. As will be understood, the negative capacitance property of the ferroelectric material layer 662 inserted into the back-gate stack 660 between the back-gate conductor layer 661 and the back-gate contact layer 663 enables back biasing with the thick buried dielectric layer 104 using a normal operating voltage, thereby providing enhanced back-gate tunability.

Non-limiting ferroelectric materials can comprise, for example, inorganic complex oxide and fluoride ferroelectrics, e.g., hafnium oxide, hafnium zirconium oxide (HfZrO$_2$), lead zirconate titanate (PZT), SrBa$_2$Ta$_2$O$_9$, PbZrTiO$_3$, Bi$_4$La$_x$Ti$_{3-x}$O$_{12}$ or BiMgF$_4$, ferroelectric polymers, such as polyvinylidene fluoride (PVDF) and its copolymers with, e.g., trifluoroethylene, P(VDF-TrFE). Example non-limiting thicknesses of the ferroelectric layer can range from 50 nm to 500 nm.

Non-limiting back-gate conducting layers can comprise, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. Non-limiting thicknesses of the layers 661 and 663 can range from 10 nm to 200 nm.

Non-limiting material deposition techniques can comprise, for example, chemical vapor deposition (CVD), physical vapor deposition (PVD), atomic layer deposition (ALD), sputtering, plating, evaporation, spin-on-coating, ion beam deposition, electron beam deposition, laser assisted deposition, chemical solution deposition, or any combination of those methods.

Figure 7:
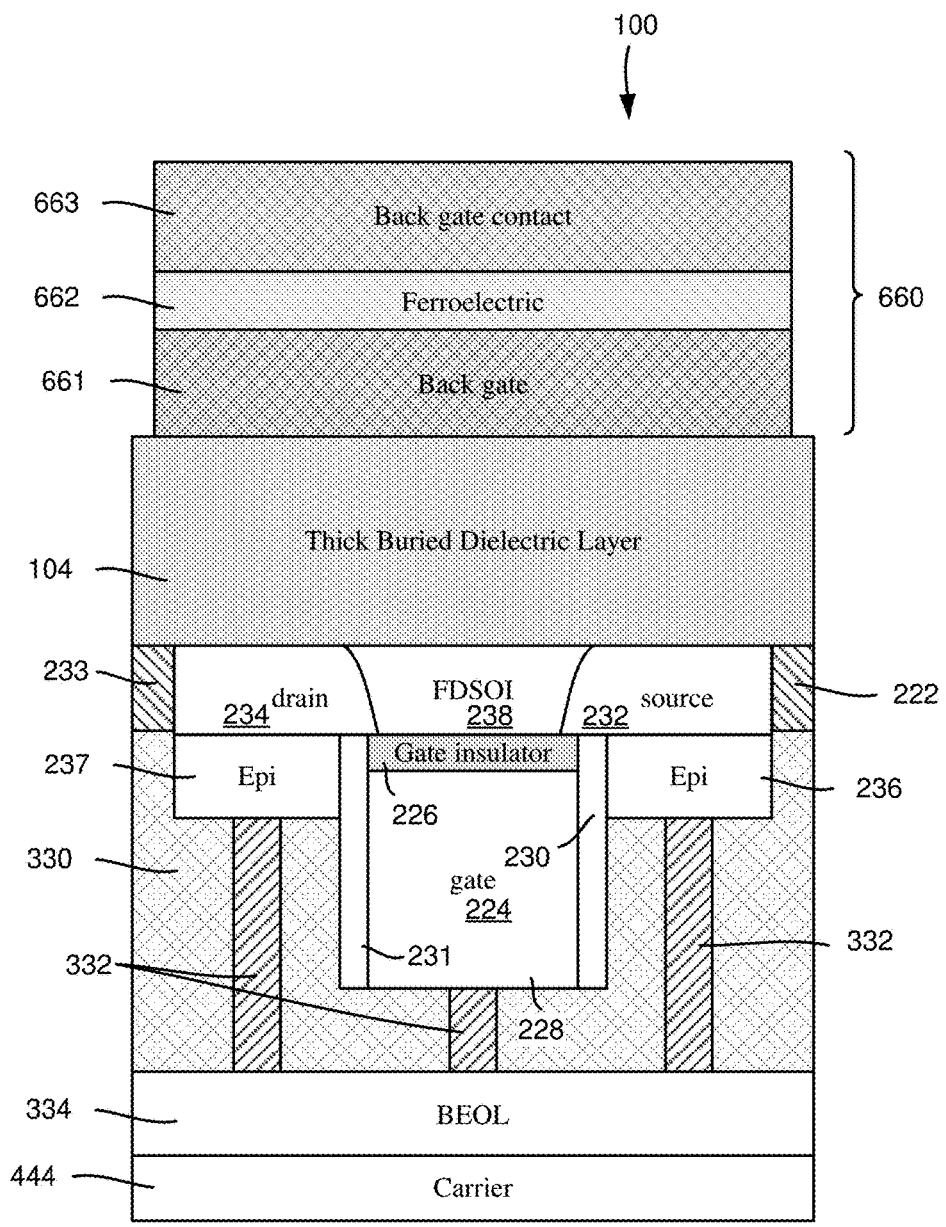
FIG. 7 is a cross-sectional view of the semiconductor structure of FIG. 6 after patterning the back-gate stack according to an example embodiment of the present disclosure.

FIG. 7 represents a state of the semiconductor device 100 after patterning the back-gate stack 660 (e.g., by lithography followed by etching in a known manner). Note that after patterning the back-gate stack 660 as represented in FIG. 7 is shown as having been narrowed (shrunk) in the lateral direction relative to the back-gate stack 660 representation in FIG. 6, however it is understood that none of the drawings or components depicted therein are intended to be to scale, and thus the amount of narrowing depicted is not intended to be representative of anything that can be considered limiting, but rather is only for purposes of illustration. Indeed, the back-gate stack and thick buried dielectric layer 104 need only cover the FDSOI channel region 238.

Figure 8:
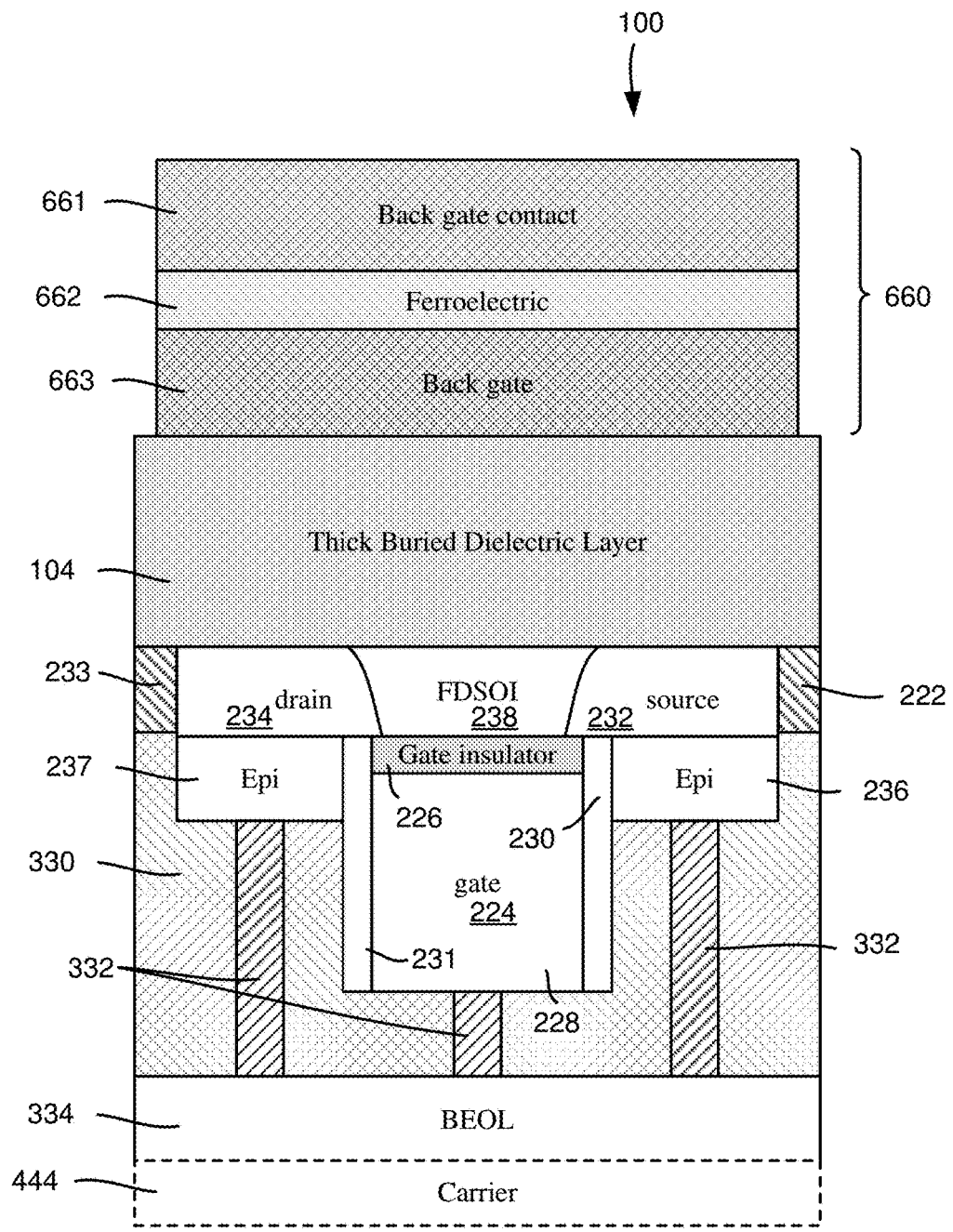
FIG. 8 is a cross-sectional view of the semiconductor structure of FIG. 7 with an option to leave or remove a carrier component according to an example embodiment of the present disclosure.

FIG. 8 generally corresponds to the representation of FIG. 7, but shows the carrier 444 as a dashed box. In general, this dashed box carrier depiction represents the option of keeping the chip (the rest of the device) on the carrier 444 if the carrier 444 is part of a chip package, for example, or removing the chip from the carrier if the carrier 444 is temporary.

Figure 9:
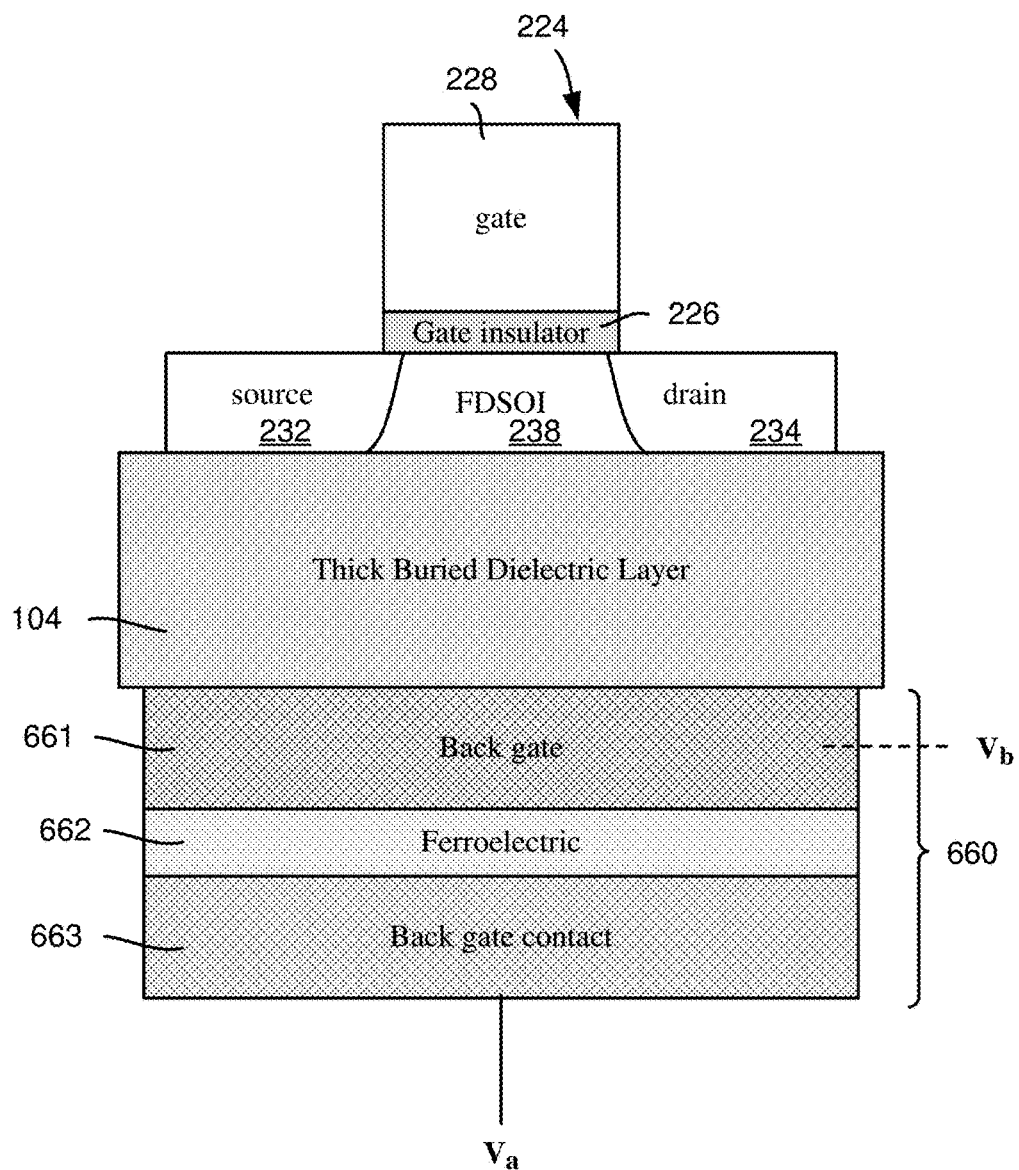
FIG. 9 is a cross-sectional view of the semiconductor structure representing voltages at relevant locations according to an example embodiment of the present disclosure.
Figure 10:
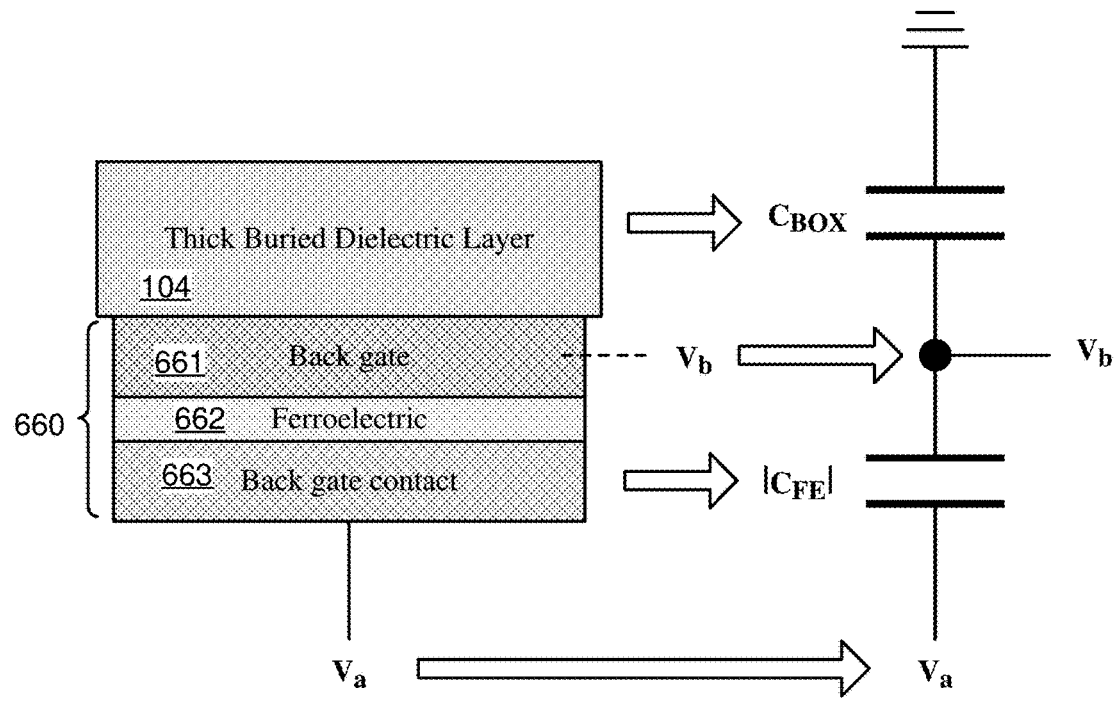
FIG. 10 is a cross-sectional view of the semiconductor structure representing voltages at relevant locations and depicting corresponding capacitances according to an example embodiment of the present disclosure.

FIGS. 9 and 10, shown in the orientation of FIGS. 1-3 (that is, flipped back relative to FIGS. 4-8), represent electrical properties of the semiconductor device with a ferroelectric material having been inserted into the back-gate stack of a FDSOI transistor. In general, when a voltage V$_a$ is applied to the back-gate contact layer 663, there is a voltage gain on the back-gate conductor layer 661 as a result of to the negative capacitance of the ferroelectric material layer 662. In other words, the effective back-gate voltage V$_b$ is greater than the applied voltage V$_a$.

The voltage gain, Av, can be determined as below:

$$(Av)=V_b/V_a=|C_{FE}|/(|C_{FE}|-C_{BOX})=1/(1-|C_{BOX}|/|C_{FE}|)$$

where C$_{BOX}$ is the BOX capacitance (or the capacitance of the thick buried dielectric layer if other than buried oxide) and |C$_{FE}$| is the absolute value of the ferroelectric capacitance. Note that FIG. 10 includes a circuit-like representation illustrating the capacitances (|C$_{FE}$| and C$_{BOX}$) and voltages (V$_a$ and V$_b$).

By way of example, consider a buried oxide (BOX) layer with a thickness of 50 nm (which provides much wider process/yield windows than a 25 nm BOX layer thickness). In this example, the BOX dielectric constant can be 3.9, along with a ferroelectric material of hafnium oxide, with a thickness of 200 nm, and a dielectric constant of approximately 20. Note that in such an example the ferroelectric material layer is thus three times the thickness of the BOX layer, but to reiterate, neither the drawings nor any of the components depicted therein are intended to be to scale herein, including to scale relative to one another.

Using the above voltage gain calculation, with |C$_{BOX}$|/|C$_{FE}$| ~0.8, Av=4, i.e., 5 times voltage gain with 50 nm BOX. Without a ferroelectric material, a 50 nm BOX provides a back-gate tunability of half that of a 25 nm BOX case. With a ferroelectric material, the 50 nm BOX provides a (approximately) 2.5 times improvement in back-gate bias tunability compared with a 25 nm BOX layer.

One or more aspects are directed towards a device comprising a buried dielectric layer 104 over a semiconductor layer 106, and a back-gate stack 660 over the buried dielectric layer 104. The back-gate stack can comprise a back-gate conductor layer 661, a ferroelectric material layer 662 over the back-gate conductor layer 661, and a back-gate contact layer 663 over the ferroelectric material layer 662.

The device can be part of a fully depleted semiconductor on insulator transistor, and the semiconductor layer can comprise a source, a drain and a channel region between the source and the drain. A gate insulator can be coupled to the semiconductor layer, and a gate can be coupled to the gate insulator.

The buried dielectric layer can comprise a buried oxide layer. The buried dielectric layer can have a thickness of greater than 25 nanometers. The buried dielectric layer can have a thickness of approximately 50 nanometers. The ferroelectric material layer can comprise hafnium oxide.

A voltage gain at the back-gate contact layer relative to an input voltage at the back-gate contact layer can be equal to an effective back-gate voltage divided by an applied back-gate voltage, which is equal to 1/(1−|C$_{BOX}$|/|C$_{FE}$|), where C$_{BOX}$ represents a capacitance of the buried dielectric layer and C$_{FE}$ represents a capacitance of the ferroelectric material layer.

A contact can be coupled to the gate. Back-end-of-line wiring can be coupled to the contact, and inter-level dielectric material can be deposited over at least part of the gate and at least part of the contact.

Figure 11:
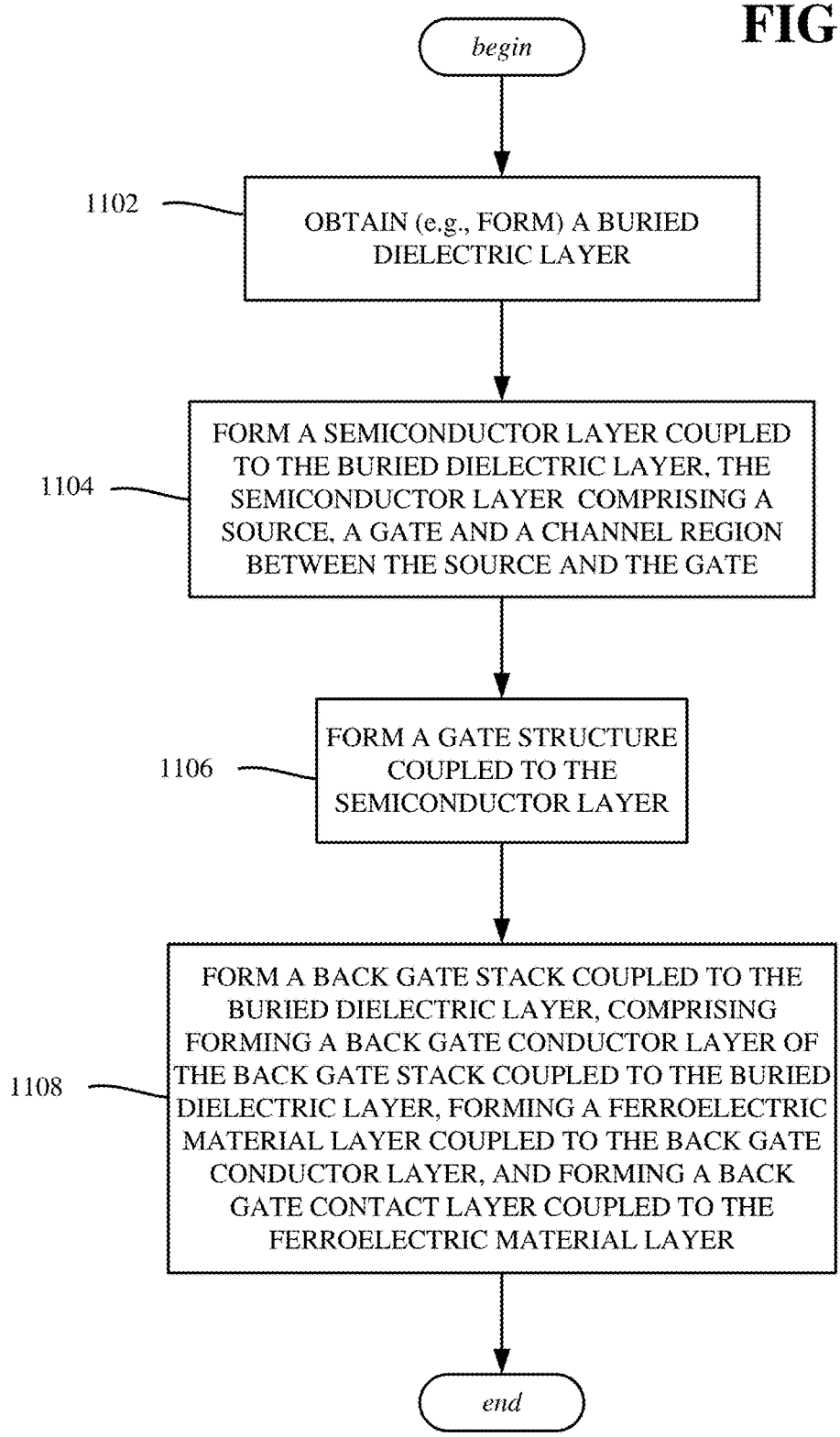
FIG. 11 is an operational flow diagram illustrating an example process for forming a FDSOI transistor according to an example embodiment of the present disclosure.

FIG. 11 shows an example method for forming a fully depleted semiconductor on insulator device, with operations exemplified as method steps. Step 1102 represents obtaining a buried dielectric layer 104. This obtaining operation can be performed by acquiring an existing component, or for example, forming a buried dielectric layer, e.g., on a supporting substrate as described herein.

Step 1104 represents forming a semiconductor layer coupled to the buried dielectric layer 104, the semiconductor layer comprising a source 232, a drain 234 and a channel region 238 between the source 232 and the drain 234. Step 1106 represents forming a gate structure 224 coupled to the semiconductor layer. Step 1108 represents forming a back-gate stack 660 coupled to the buried dielectric layer, comprising forming a back-gate conductor layer 661 of the back-gate stack coupled to the buried dielectric layer 104, forming a ferroelectric material layer 662 coupled to the back-gate conductor layer 661, and forming a back-gate contact layer 663 coupled to the ferroelectric material layer 662.

Thus, obtaining the buried dielectric layer can comprise forming the buried dielectric layer over a substrate. The obtaining the buried dielectric layer can comprise forming a buried oxide layer over a substrate.

Forming the buried dielectric layer can comprise forming the buried dielectric layer with a thickness greater than 25 nanometers. Forming the buried dielectric layer can comprise forming the buried dielectric layer with a thickness of approximately 50 nanometers.

Figure 12:
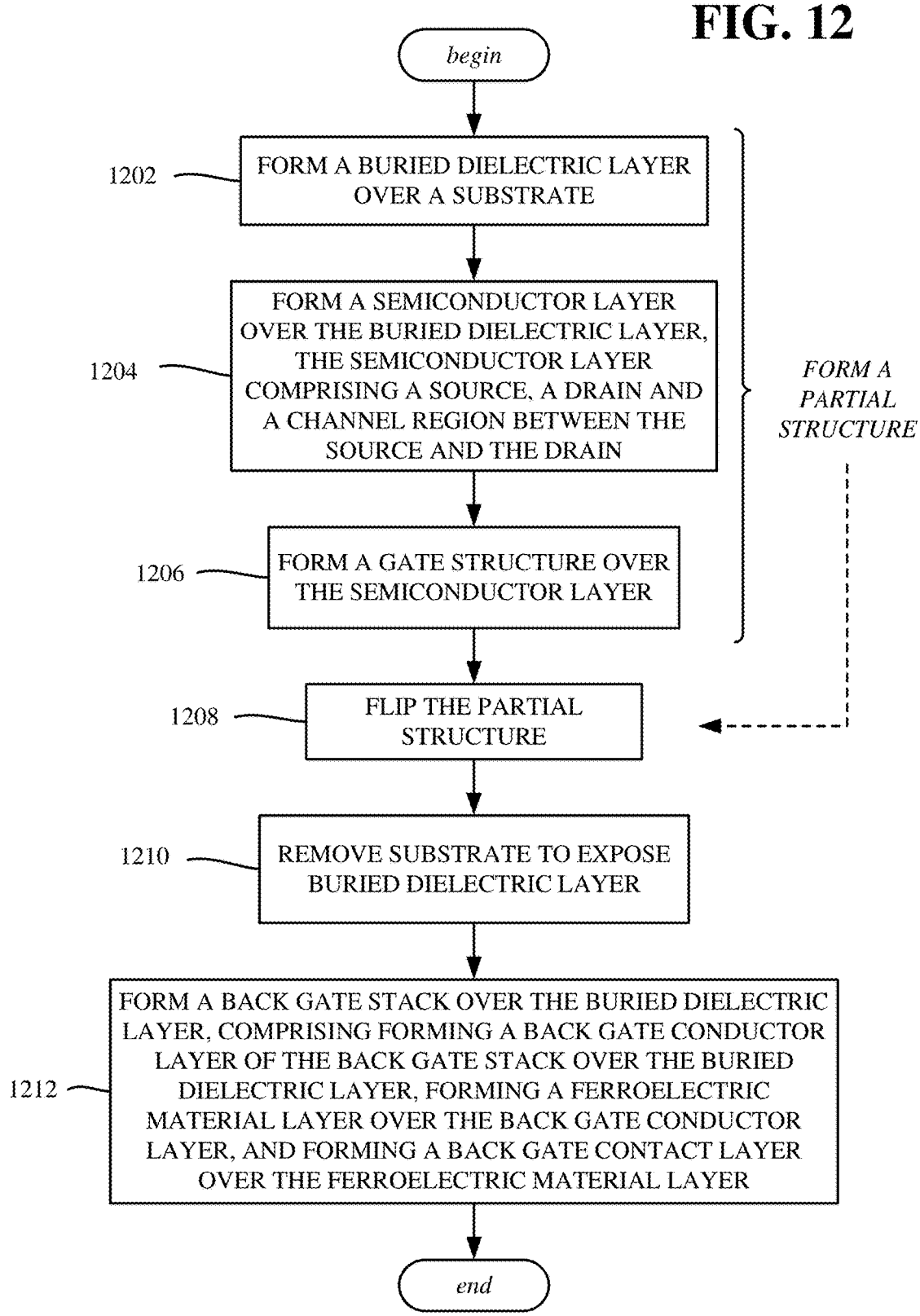
FIG. 12 is an operational flow diagram illustrating an example process with further example operations for forming a FDSOI transistor according to an example embodiment of the present disclosure.

FIG. 12 shows additional fabrication operations represented by method steps that can be performed in one or more embodiments. Step 1202 represents an operation to form a buried dielectric layer over a substrate. Step 1204 represents an operation to form a semiconductor layer over the buried dielectric layer, the semiconductor layer comprising a source, a gate and a channel region between the source and the gate. Step 1206 represents operation to form a gate structure over the semiconductor layer. Note that steps 1202, 1204 and 1206 form a partial structure.

Step 1208 flips the partial structure into a flipped orientation, and step 1210 removes the substrate to expose the buried dielectric layer.

Step 1212 represents, while in the flipped orientation, forming a back-gate stack over the buried dielectric layer, comprising forming a back-gate conductor layer of the back-gate stack over the buried dielectric layer, forming a ferroelectric material layer over the back-gate conductor layer, and forming a back-gate contact layer over the ferroelectric material layer.

According to yet another embodiment, a semiconductor device (e.g., a fully depleted semiconductor on insulator transistor) can comprise a back-gate stack 660, the back-gate stack comprising a back-gate contact layer 663, a ferroelectric material layer 662 coupled to the back-gate contact layer 663, and a back-gate conductor layer 661 coupled to the ferroelectric material layer 662. The semiconductor device can further comprise a buried dielectric layer 104 coupled to the back-gate conductor layer 661 of the back-gate stack 660, a semiconductor layer coupled to the buried dielectric layer 104, the semiconductor layer comprising a source 232, a drain 234 and a channel region 238 between the source 232 and the drain 234, a gate insulator 226 coupled to the channel region 238 and a gate conductor 228 coupled to the gate insulator 226.

The buried dielectric layer can comprise a buried oxide layer. The buried dielectric layer can have a thickness of greater than 25 nanometers. The buried dielectric layer can have a thickness of approximately 50 nanometers. The ferroelectric material layer can comprise hafnium oxide.

The semiconductor device can comprise a contact coupled to the gate, back-end-of-line wiring coupled to the contact and a carrier coupled to the back-end-of-line wiring.

As can be seen, there is described a device structure, a semiconductor device structure, a fully depleted semiconductor on insulator transistor structure and a method for forming same with a relatively thick buried dielectric layer and enhanced back-gate tunability by using a ferroelectric insulator as part of a back-gate stack. The negative capacitance property of the ferroelectric insulator enables back biasing with the thick buried dielectric layer and normal operating voltages.

What has been described above include mere examples. It is, of course, not possible to describe every conceivable combination of components, materials or the like for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a fully depleted semiconductor on insulator device, comprising:
   forming a buried dielectric layer over a substrate;
   forming a partial structure in which a semiconductor layer is coupled to and over the buried dielectric layer, and a gate structure is coupled to and over the semiconductor layer; and
   flipping the partial structure into a flipped orientation with the buried dielectric layer over the semiconductor layer and the semiconductor layer over the gate structure, and removing the substrate to expose buried dielectric layer;
   in the flipped orientation, forming a back-gate stack coupled to the buried dielectric layer, comprising forming a back-gate conductor layer of the back-gate stack coupled to and over the buried dielectric layer, forming a ferroelectric material layer coupled to and over the back-gate conductor layer, and forming a back-gate contact layer coupled to and over the ferroelectric material layer.

2. The method of claim 1, wherein the forming the buried dielectric layer comprises forming a buried oxide layer over the substrate.

3. The method of claim 1, wherein the forming the buried dielectric layer comprises forming the buried dielectric layer with a thickness greater than 25 nanometers.

4. The method of claim 1, wherein the forming the buried dielectric layer comprises forming the buried dielectric layer with a thickness of approximately 50 nanometers.

* * * * *